(12) United States Patent
Chu et al.

(10) Patent No.: US 12,272,729 B2
(45) Date of Patent: Apr. 8, 2025

(54) ASYMMETRIC SOURCE/DRAIN FOR BACKSIDE SOURCE CONTACT

(71) Applicant: Taiwan Semiconductor Manufacturing Company, Ltd., Hsinchu (TW)

(72) Inventors: Feng-Ching Chu, Pingtung County (TW); Wei-Yang Lee, Taipei (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 525 days.

(21) Appl. No.: 17/308,678

(22) Filed: May 5, 2021

(65) Prior Publication Data

US 2022/0359676 A1    Nov. 10, 2022

(51) Int. Cl.
*H01L 29/417* (2006.01)
*H01L 21/02* (2006.01)
*H01L 29/06* (2006.01)
*H01L 29/423* (2006.01)
*H01L 29/66* (2006.01)
*H01L 29/786* (2006.01)

(52) U.S. Cl.
CPC .. *H01L 29/41733* (2013.01); *H01L 21/02532* (2013.01); *H01L 21/0259* (2013.01); *H01L 29/0665* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
CPC ......... H01L 29/42392; H01L 29/66545; H01L 29/66553; H01L 29/66636; H01L 21/76897
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |

(Continued)

*Primary Examiner* — William B Partridge
*Assistant Examiner* — David Paul Sedorook
(74) *Attorney, Agent, or Firm* — HAYNES AND BOONE, LLP

(57) ABSTRACT

According to one example, a method includes performing a first etching process on a fin stack to form a first recess and a second recess at a first depth, the first recess and the second recess on opposite sides of a gate structure that is on the fin stack. The method further includes depositing inner spacers within the first recess and the second recess. The method further includes, after depositing the inner spacers, performing a second etching process to extend a depth of the first recess to a second depth. The method further includes forming a dummy contact region within the first recess, forming a source structure within the first recess on the dummy contact region, and forming a drain structure within the second recess.

20 Claims, 13 Drawing Sheets

(56) References Cited

U.S. PATENT DOCUMENTS

| | | | |
|---|---|---|---|
| 9,576,814 B2 | 2/2017 | Wu et al. | |
| 9,548,303 B2 | 7/2017 | Lee et al. | |
| 2013/0285116 A1 | 10/2013 | Lochtefeld et al. | |
| 2014/0252477 A1* | 9/2014 | Tseng | H01L 21/283 |
| | | | 438/151 |
| 2016/0336183 A1* | 11/2016 | Yuan | H01L 27/0886 |
| 2019/0221649 A1* | 7/2019 | Glass | H01L 21/823418 |
| 2020/0075738 A1* | 3/2020 | Zang | H01L 29/785 |
| 2020/0091348 A1* | 3/2020 | Guha | H01L 29/41766 |
| 2020/0343257 A1* | 10/2020 | Yau | H10B 43/27 |
| 2022/0052043 A1* | 2/2022 | More | H01L 29/7851 |
| 2022/0069117 A1* | 3/2022 | Yu | H01L 29/785 |
| 2022/0238659 A1* | 7/2022 | Lee | H01L 29/41791 |
| 2022/0328657 A1* | 10/2022 | Lu | H01L 29/4175 |
| 2022/0352326 A1* | 11/2022 | Huang | H01L 29/0673 |

* cited by examiner

ASYMMETRIC SOURCE/DRAIN FOR BACKSIDE SOURCE CONTACT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
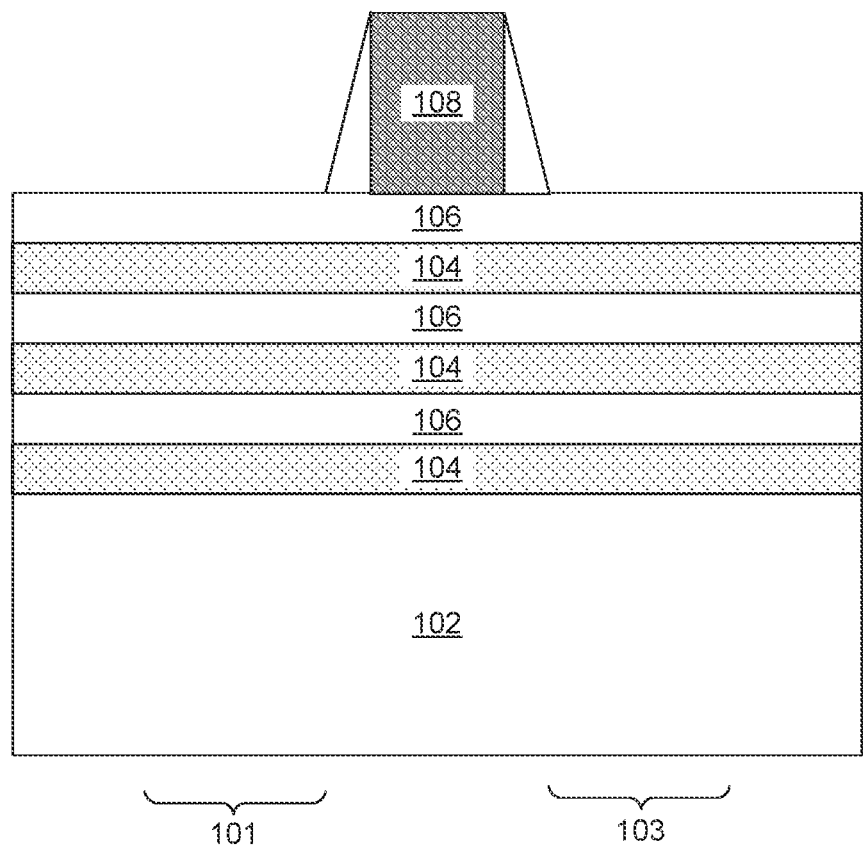
FIGS. 1A, 1B, 1C, 1D, 1E, 1F, 1G, 1H, 1I, 1J, 1K, and 1L are diagrams showing an illustrative process for forming asymmetric source and drain structures for a backside contact, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In some example embodiments, to form a GAA device, a semiconductor fin may include a total of three to ten alternating layers of semiconductor materials. For example, the first semiconductor material may be silicon, and the second semiconductor material may be silicon germanium. Either of the semiconductor materials and (or both) may be doped with a suitable dopant, such as a p-type dopant or an n-type dopant, for forming desired FETs. The semiconductor materials and may each be formed by an epitaxial process, such as, for example, a molecular beam epitaxy (MBE) process, a CVD process, and/or other suitable epitaxial growth processes.

Alternating layers of the semiconductor materials are configured to provide nanowire or nanosheet devices such as GAA FETs, the details of forming which are provided below. GAA FETs have been introduced in effort to improve gate control by increasing gate-channel coupling, reduce OFF-state current, and reduce short-channel effects. A multi-gate device such as a GAA FET generally includes a gate structure that extends around its channel region (horizontal or vertical), providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs.

In a GAA device, a channel stack is formed by depositing alternating layers of semiconductor material that may be selectively etched. For example, a first type of semiconductor material may be epitaxially grown on a substrate. Then, a second type of semiconductor material may be epitaxially grown on that first layer. The process continues by forming alternating layers of the first and second semiconductor material. Then, the channel stacks may be patterned into fin structures. Each fin may thus be a fin stack of alternating semiconductor layers. Then, an etching process (e.g., a wet etching process) can be used to remove the first semiconductor material while leaving the second semiconductor material substantially intact. The remaining second semiconductor material may thus form a stack of nanowires or nanosheets extending between two active regions. A gate device can then be formed to completely surround each of the nanowires or nanosheets. On each side of the gate device is a source or drain region.

In conventional fabrication techniques, source and drain features are formed by performing an etching process to form recesses for both the source and drain region. Such recesses are typically formed at a similar depth. Then, an epitaxial growth process is used to grow the source and drain structures within the recesses. In some cases, after the source and drain structures have been formed, a backside contact to the source structure may be formed. Forming a backside contact involves patterning the backside of the wafer to expose the bottom of the source structure and then forming a conductive contact structure to connect to the source structure. However, as technology nodes shrink, it becomes more difficult to accurately align the backside source contact.

According to principles described herein, a backside source contact is aligned more efficiently and effectively. In particular, when forming the recesses for the source and the drain structures, the recess for the source structure is extended deeper into the substrate. Then, a dummy source contact is formed within the recess for the source structure. After the dummy source contact is formed, then the source and drain regions can be epitaxially grown within their respective recesses. Afterwards, during the backside processing, the dummy source contact is exposed, removed, and then replaced with a real source contact. The techniques described herein improve the alignment of the source contact with the source device and thus improve the performance of the device. In some embodiments, the asymmetrical source/drain feature can have a deeper drain feature in contact with a backside contact feature as per the design requirement.

FIGS. 1A, 1B, 1C, 1D, 1E, 1F, 1G, 1H, 1I, 1J, 1K, and 1L are diagrams showing an illustrative process for forming asymmetric source and drain structures for a backside contact. FIG. 1A is a diagram showing a cross-sectional view of an illustrative workpiece. The workpiece includes a semiconductor substrate 102. The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

FIG. 1A illustrates a fin stack that includes alternating semiconductor layers 104, 106. The alternating layers are deposited onto the substrate 102. For example, a first type semiconductor layer 104 is deposited on the substrate 102. The first type semiconductor material is a sacrificial material that will ultimately be removed. Thus, this layer will also be referred to as the sacrificial semiconductor layer. Then, a second type semiconductor material 106 is deposited. The second type semiconductor layer will ultimately form part of the channel of a nanostructure transistor device. Thus, the second type semiconductor layer will also be referred to as a channel semiconductor layer. Formation of both the first type semiconductor material and the second type semiconductor material may be done using an epitaxial growth process. The process of forming the first type semiconductor material and the second type semiconductor material may be repeated until the desired number of layers are reached.

After the desired number of semiconductor layers 104, 106 has been achieved, a gate structure 108 may be formed on top of the fin stack. The gate structure 108 may have sidewall structures formed thereon. In some examples, the gate structure 108 may be a dummy gate structure that will eventually be replaced with a real metal or conductive gate.

FIG. 1A also illustrates two different regions 101, 103. The first region 101 will be referred to as a source region because it corresponds to where a source structure is to be formed. The second region 103 will be referred to as the drain region because it corresponds to where a drain structure is to be formed.

Figure 1B:
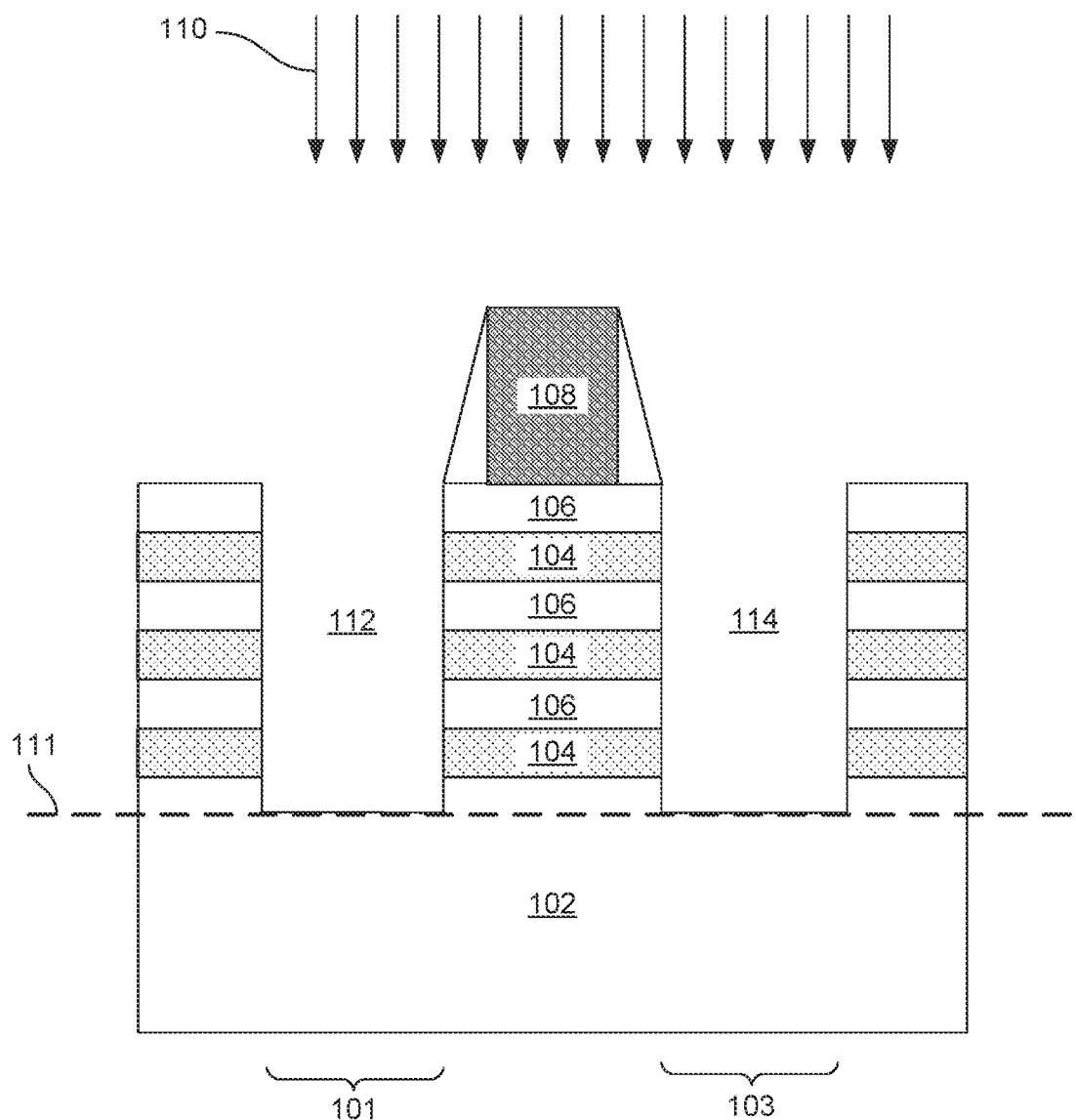

FIG. 1B illustrates a first patterning process 110 to form recesses 112, 114 within the fin stack in the regions where the source and drain structures are to be formed. In particular, the patterning process 110 forms recess 112 in the source region 101 and forms recess 114 in the drain region. The patterning process may include a photolithographic process. For example, a hard mask layer and a photoresist layer may be deposited upon the workpiece. The hardmask layer may include at least one of silicon oxide (SiO2), silicon nitride (SiN), silicon carbide (SiC), silicon oxynitride (SiON), silicon oxycarbide (SiOC), hafnium oxide (HfO2), aluminum oxide (Al2O3), and zirconium oxide (ZrO2).

Then, the photoresist layer may be exposed to a light source through a photomask. The photoresist may then be developed. Then, an etching process may be applied to transfer the pattern in the photoresist to the hard mask layer. After this process, the hard mask exposes portions of the alternating set of layers 104, 106. Then, a directional etching process such as a dry etching process is used to pattern the semiconductor layers 104, 106. The etching process may continue until the recesses 112 and 114 reach a first depth 111. In one example, the first depth is within a range of about 55-75 nanometers.

Figure 1C:
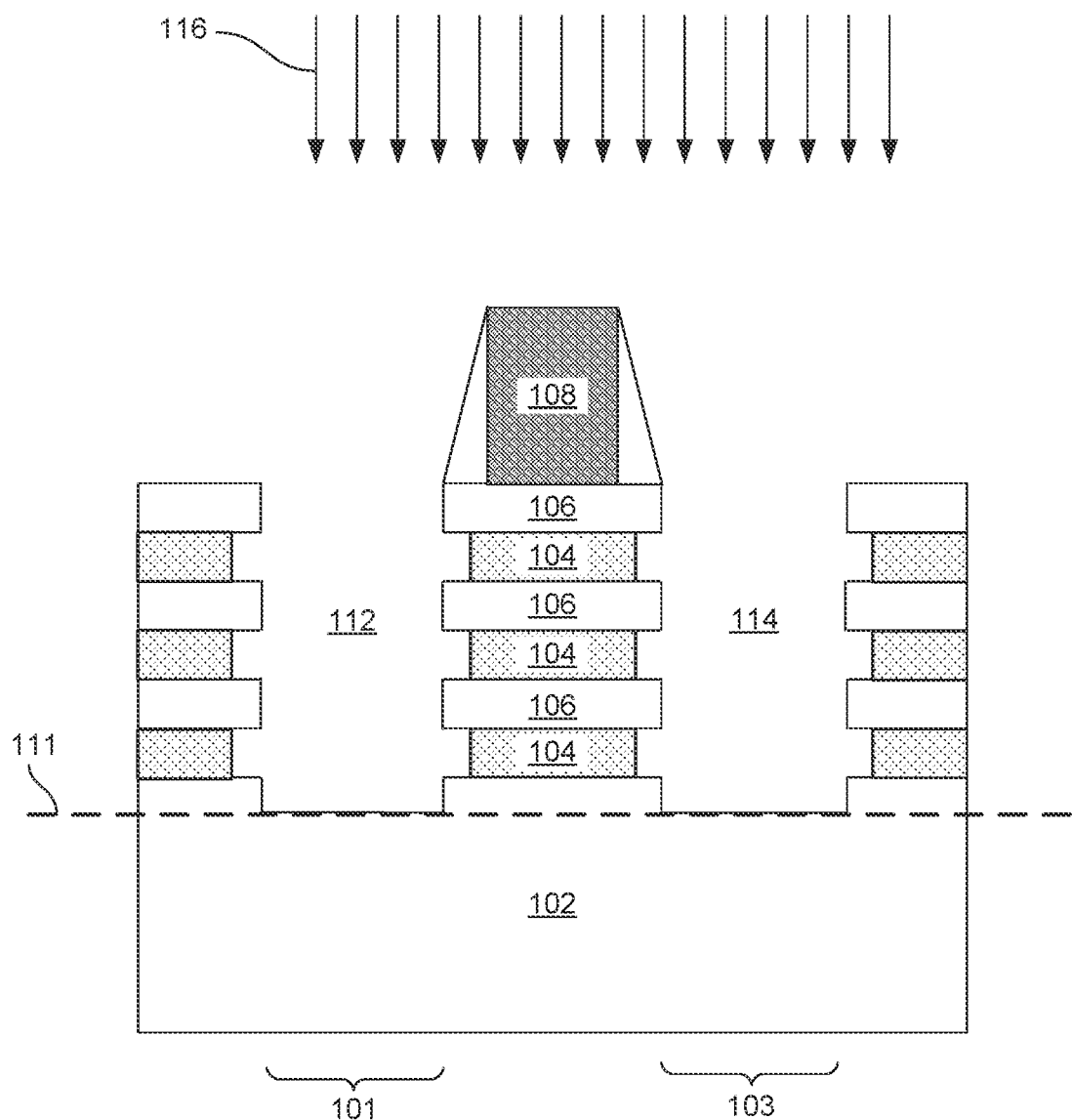

FIG. 1C illustrates a lateral etching process 116 to partially remove the sacrificial semiconductor layers 104. The lateral etching process 116 may be, for example, a wet etching process. The etching process 116 may be designed to be selective so as to remove the sacrificial semiconductor layer 104 without substantially affecting the semiconductor layer 106. For example, in the case where the sacrificial semiconductor layer is silicon germanium and the semiconductor layer is silicon, then the etching process 116 may be configured to remove silicon germanium without substantially affecting silicon.

Figure 1D:
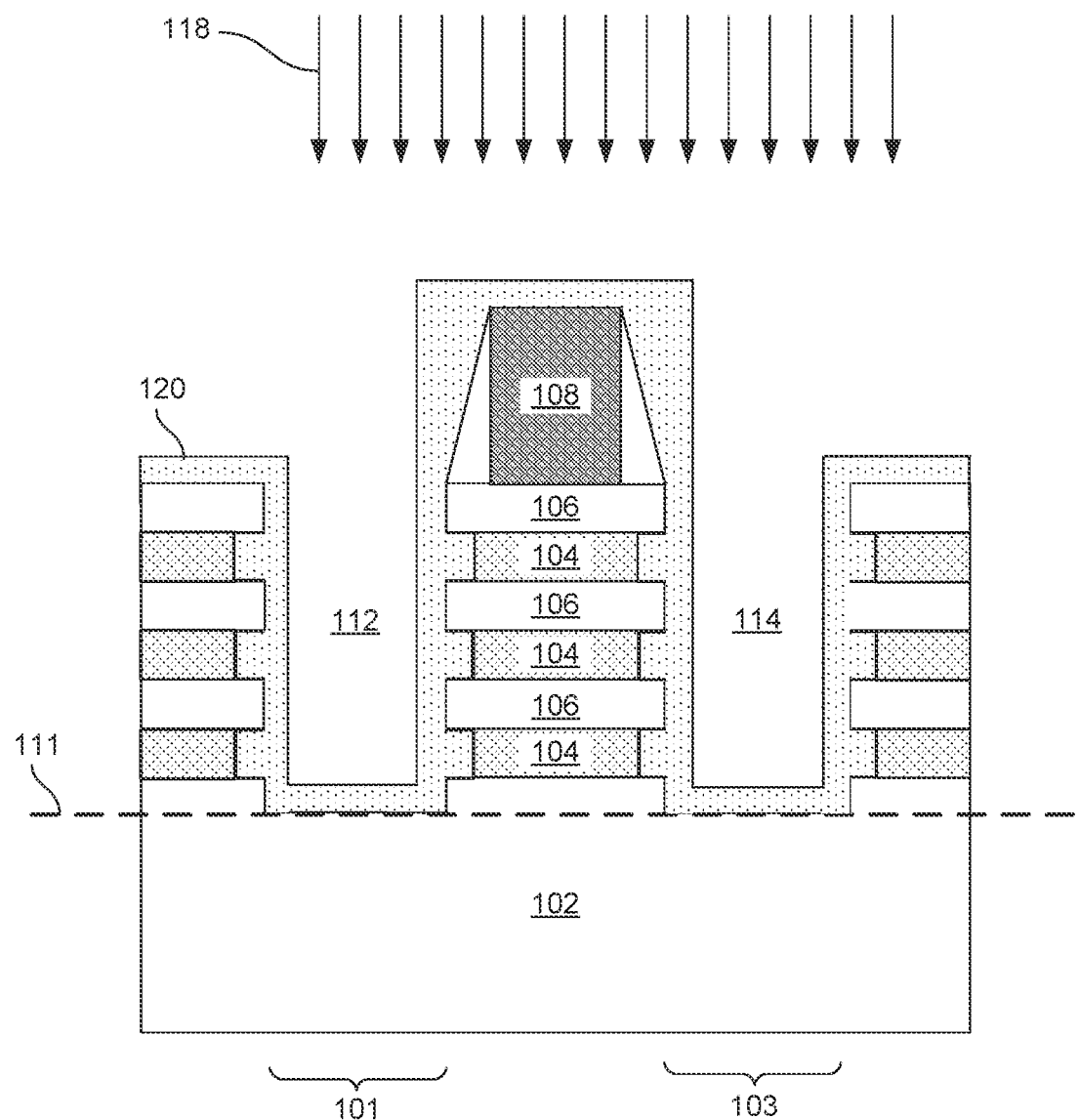

FIG. 1D illustrates a deposition process 118 that forms inner spacer layer 120 along each of the remaining portions of the workpiece. Specifically, the inner spacer layer 120 is formed by a conformal deposition process so that the inner spacer layer 120 is formed along sidewalls of the recesses 112, 114, as well as along the floor of the recesses 112, 114. The inner spacer layer 120 may be a dielectric material such as SiCN, SiOCN, or SiON.

Figure 1E:
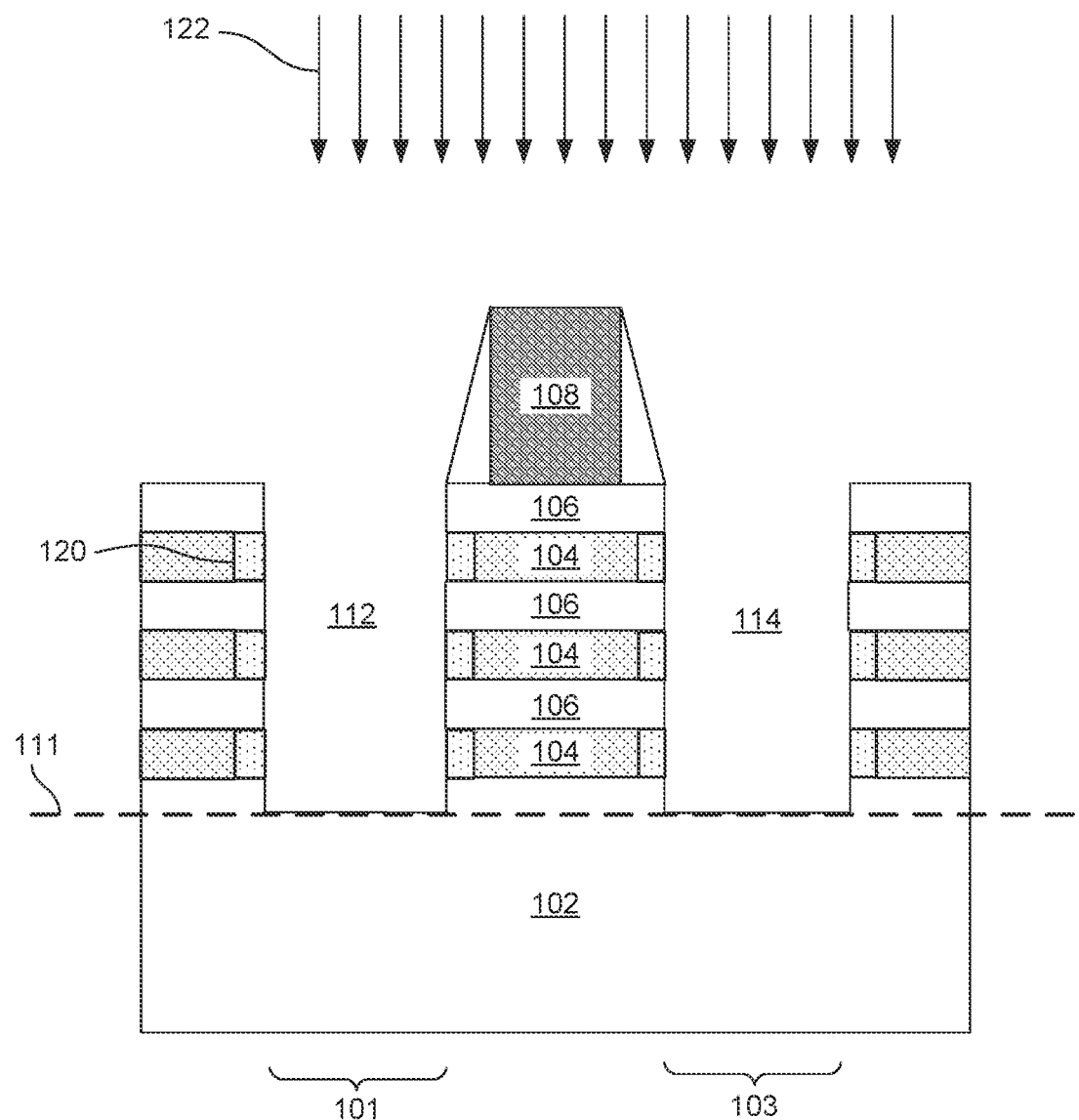

FIG. 1E illustrates an etch back process 122 to remove portions of the inner spacer layer and to expose the channel layers 106. The etch back process 122 also removes the inner spacer layer from the floor of the recesses and the top of the workpiece. The remaining portions of the inner spacer layers serve to electrically isolate the portions of the gate structure that replace layer 104 with the source and drain regions to be formed within the recesses 112, 114. In some examples, the remaining inner spacer layer may vary within a range of width between about 4-15 nanometers.

Figure 1F:
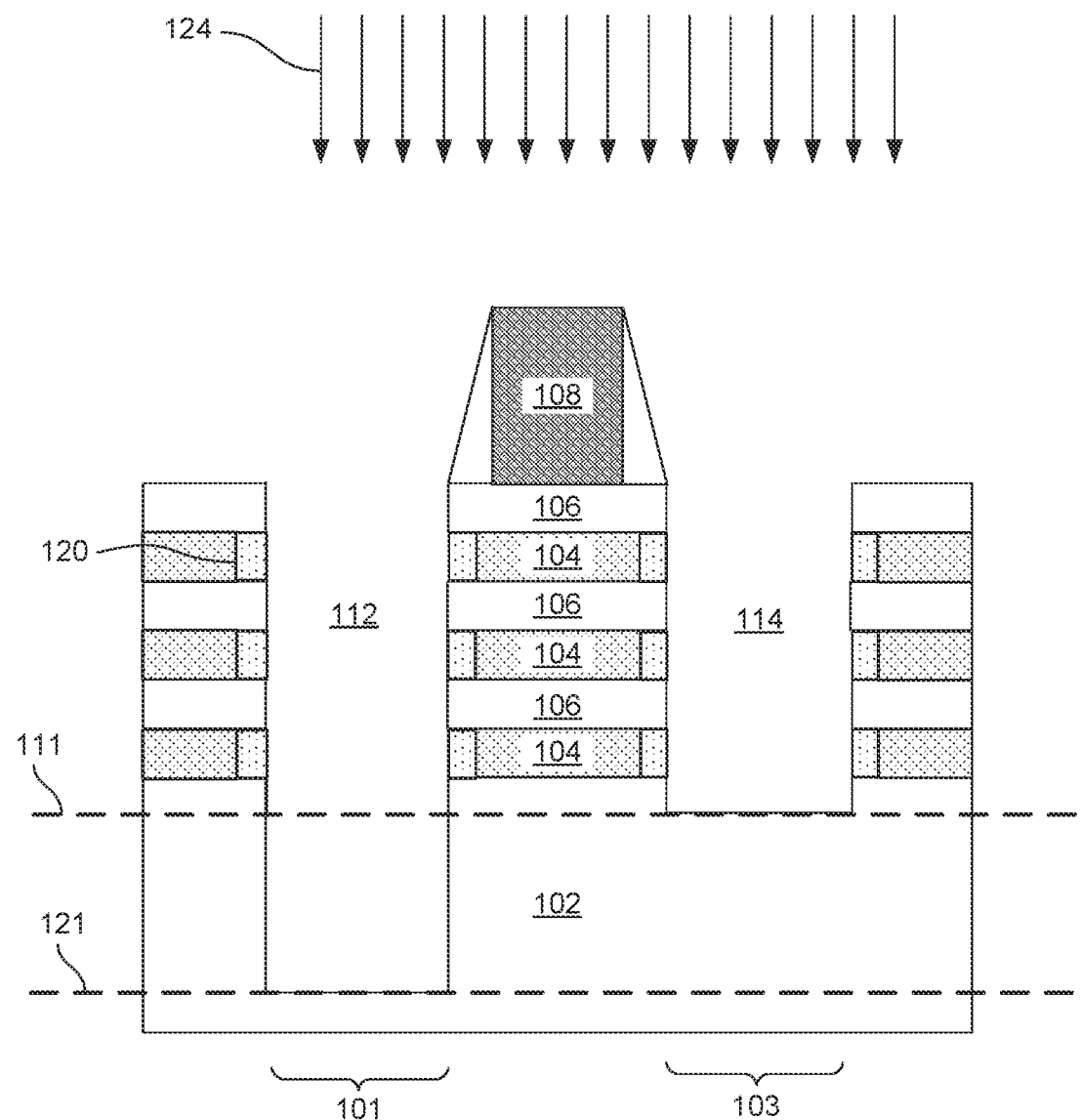

FIG. 1F illustrates a second patterning process 124 to further extend the depth of recess 112 to a second depth 121. The second patterning process may include a photolithographic process. For example, a hard mask layer and a photoresist layer may be deposited upon the workpiece. The hardmask layer may include at least one of silicon oxide (SiO2), silicon nitride (SiN), silicon carbide (SiC), silicon oxynitride (SiON), silicon oxycarbide (SiOC), hafnium oxide (HfO2), aluminum oxide (Al2O3), and zirconium oxide (ZrO2).

Then, the photoresist layer may be exposed to a light source through a photomask. The photoresist may then be developed. Then, an etching process may be applied to transfer the pattern in the photoresist to the hard mask layer. The patterned photomask layer may expose the source region 101 but cover the drain region. Thus, the subsequent etching process used to extend the depth of the source recess 112 is not applied to the drain recess 114. The etching process may extend the depth of the recess 112 another 45-65 nanometers. Accordingly, the source and drain recesses have asymmetric depths.

Figure 1G:
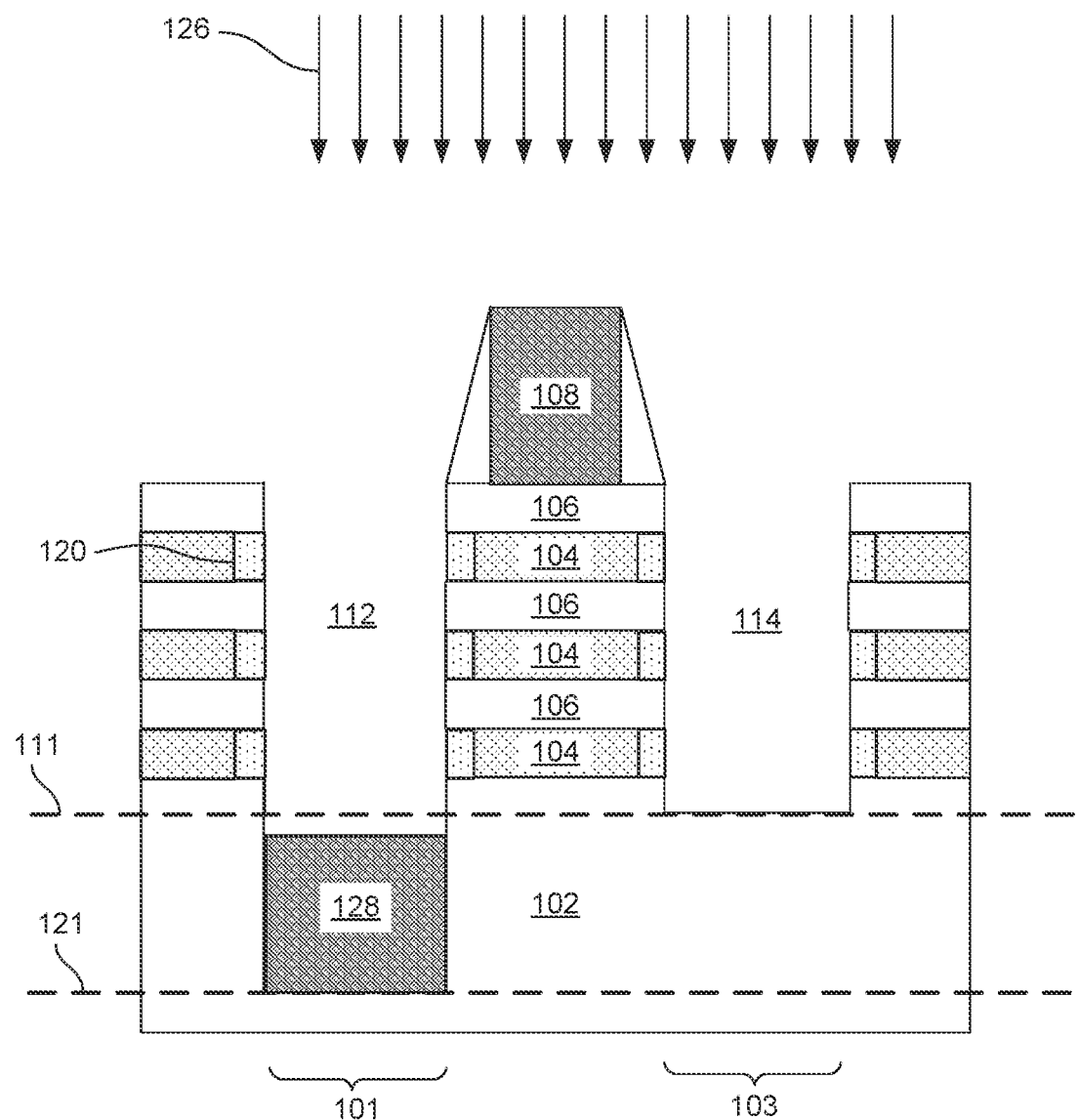

FIG. 1G illustrates a formation process 126 to form a dummy source contact region 128 within the source recess 112. The formation process 126 may be, for example, an epitaxial growth process. The dummy source contact region may be, for example, made of silicon germanium without dopants. In some examples, the ratio of germanium to silicon in the silicon germanium may be within a range of about 30-40 percent.

Figure 1H:
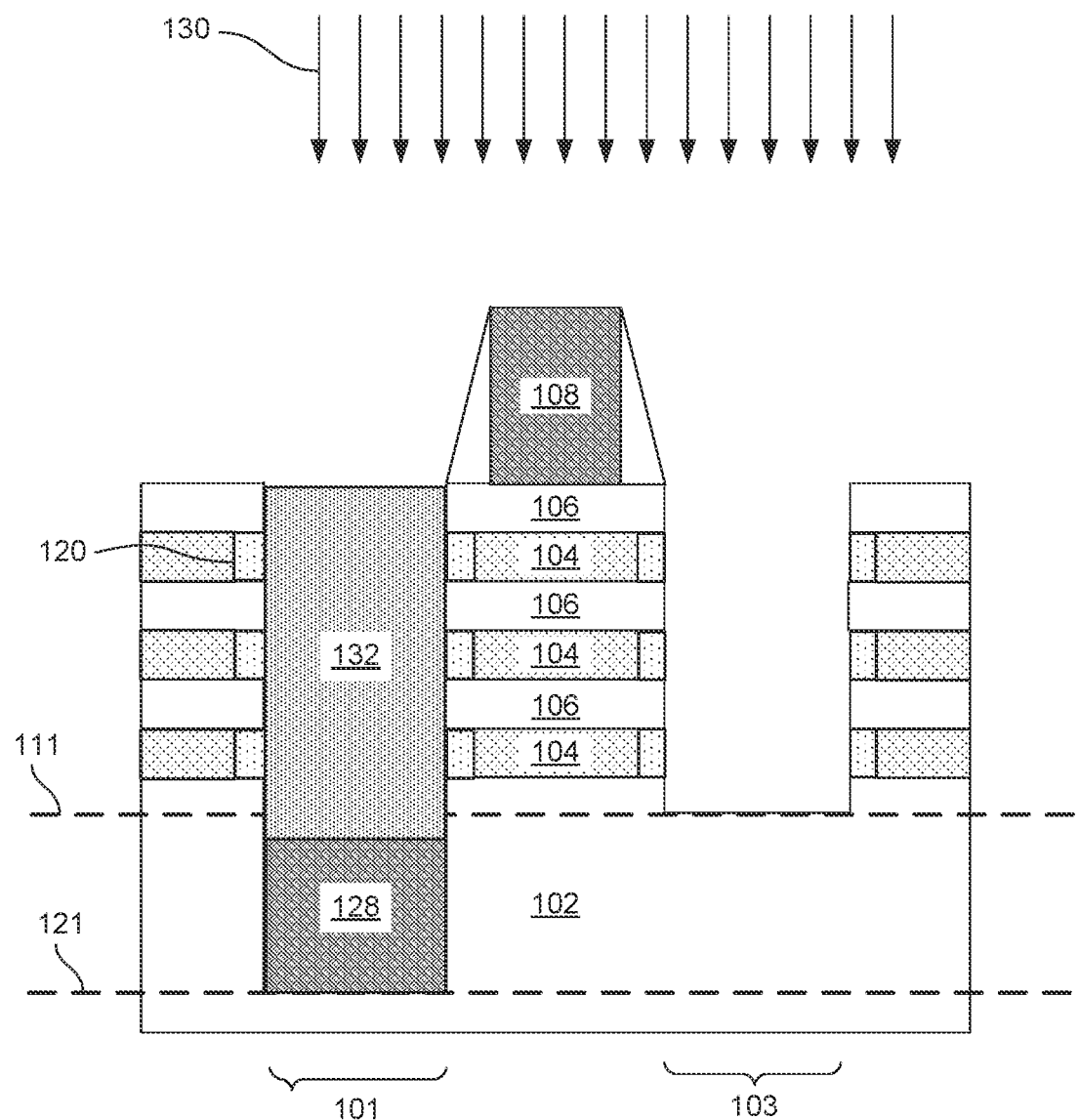
Figure 1I:
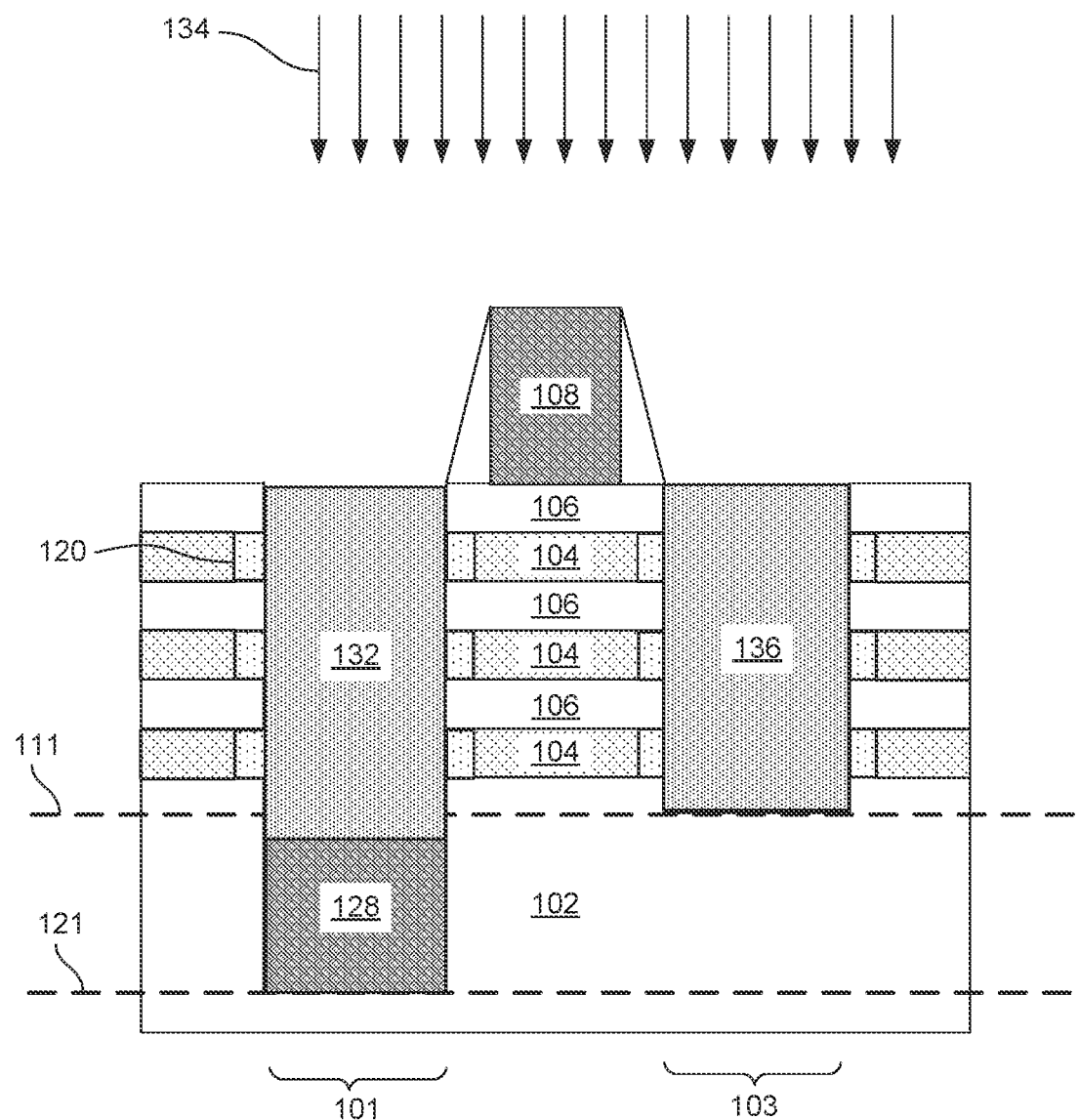

FIG. 1H illustrates a formation process 130 to form a source structure 132 in the source recess 112. FIG. 1I illustrates a formation process 134 to form a drain structure 136 in the drain recess 114. In some examples, the source and drain regions are created by performing an epitaxial growth process. An epitaxial growth process involves forming a crystal structure on a crystal substrate. In the present example, the source and drain regions are grown from the substrate 102 and channel regions 106. In some examples, the source and drain regions may be doped in situ so as to obtain the desired properties.

In some examples, after the source structure 132 and drain structure 136 are formed, the dummy gate structure 108 may be replaced with a real gate. This may be done by removing the sacrificial semiconductor materials underneath the gate layer 108. Additionally, the process involves removing the dummy gate layers 108. In some examples, before such features are removed, an interlayer dielectric (ILD) is deposited on top of the source and drain structures. The removal process may be, for example a wet etching process. The wet etching process may be selective so as to remove the sacrificial semiconductor layers 104 leaving the channel layers 106 substantially intact. The wet etching process may use an acid-based etchant such as: sulfuric acid (H2SO4), perchloric acid (HClO4), hydroiodic acid (HI), hydrobromic acid (HBr), nitric acide (HNO3), hydrochloric acid (HCl), acetic acid (CH3COOH), citric acid (C6H8O7), potassium periodate (KIO4), tartaric acid (C4H6O6), benzoic acid (C6H5COOH), tetrafluoroboric acid (HBF4), carbonic acid (H2CO3), hydrogen cyanide (HCN), nitrous acid (HNO2), hydrofluoric acid (HF), or phosphoric acid (H3PO4). In some examples, an alkaline-based etchant may be used. Such etchants may include but are not limited to ammonium hydroxide (NH4OH) and potassium hydroxide (KOH). By removing the sacrificial semiconductor layers 104, the channel layers 106 thus become nanostructures extending between source and drain structures 132, 136.

After the dummy gate structure is removed, a real gate structure is formed. Formation of the real gate device may include a number of steps. For example, a high-k dielectric layer may be deposited so as to surround the channel layers 106. The high-k dielectric layer may include, for example, aluminum oxide, hafnium oxide, zirconium oxide, hafnium aluminum oxide, or hafnium silicon oxide. Other materials may be used as well. For example, other materials with a dielectric constant greater than 7 may be used.

In some examples, depending on the type of transistor device being formed, a work function layer may be deposited. Such metal is designed to metal gates the desired properties for ideal functionality. Various examples of a p-type workfunction metal may include, but are not limited to, tungsten carbon nitride (WCN), tantalum nitride (TaN), titanium nitride (TiN), titanium aluminum nitride (TiAlN), tungsten sulfur nitride (TSN), tungsten (W), cobalt (Co), molybdenum (Mo), etc. Various examples of n-type workfunction metals include, but are not limited to, aluminum (Al), titanium aluminum (TiAl), titanium aluminum carbide (TiAlC), titanium aluminum silicon carbide (TiAlSiC), tantalum aluminum silicon carbide (TaAlSiC), and hafnium carbide (HfC). Then, a gate layer is deposited. The gate layer may be a conductive material such as a metal material. In this manner, the gate layer entirely surrounds each of the channel layers 106. The replaced gate structure 109 is shown in FIG. 1J.

Figure 1J:
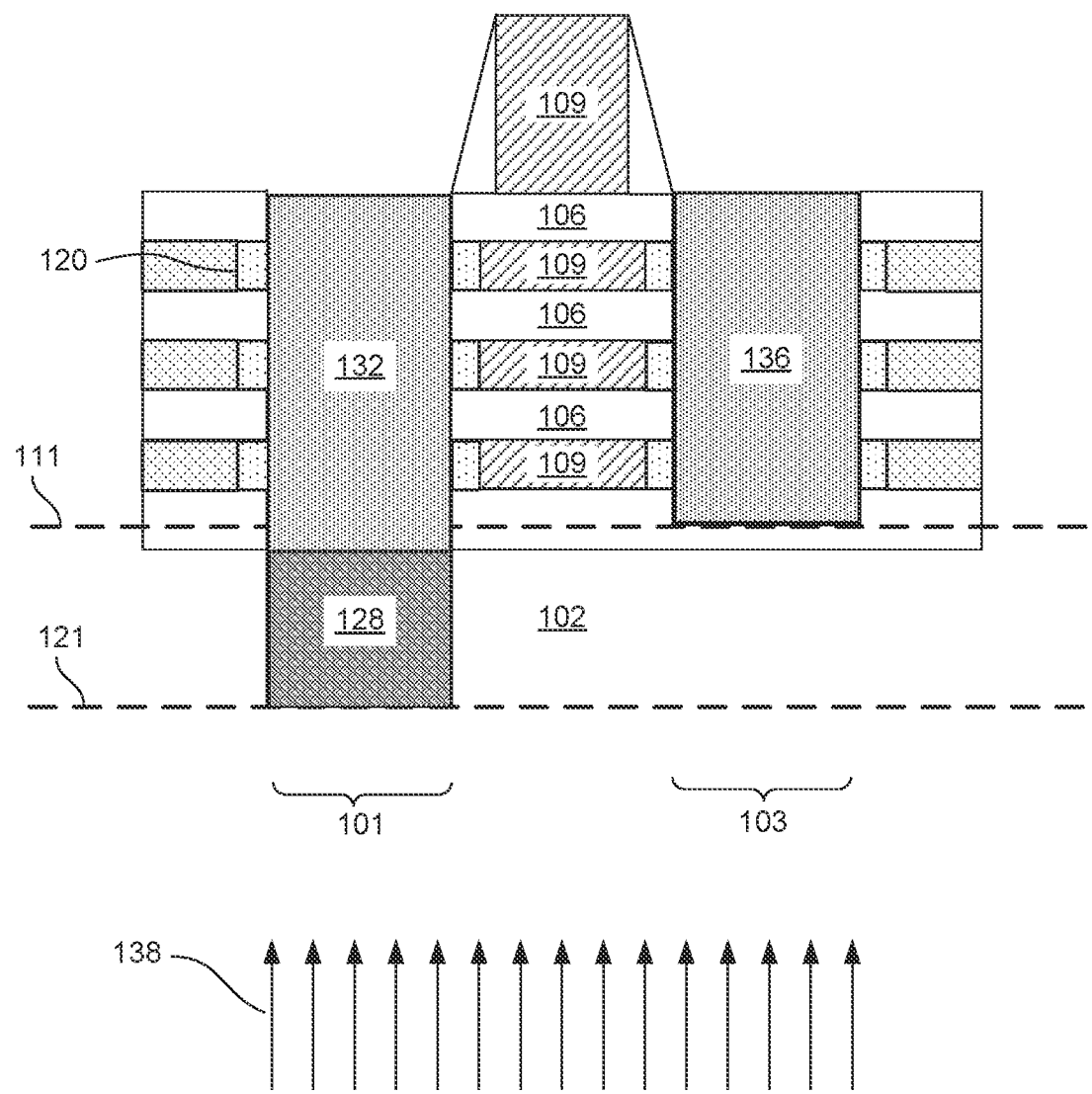

FIG. 1J also illustrates the beginning of a Back-End-of-Line (BEOL) process to form a source contact structure. To do this, a removal process 138 is applied to the backside of the workpiece to remove the backside portion of the substrate 102 and expose the dummy source contact structure 128. This removal process may be, for example, a wet etching process. The wet etching process may be selective so as to remove the semiconductor substrate 102 while leaving the dummy source contact structure 128 substantially intact.

Figure 1K:
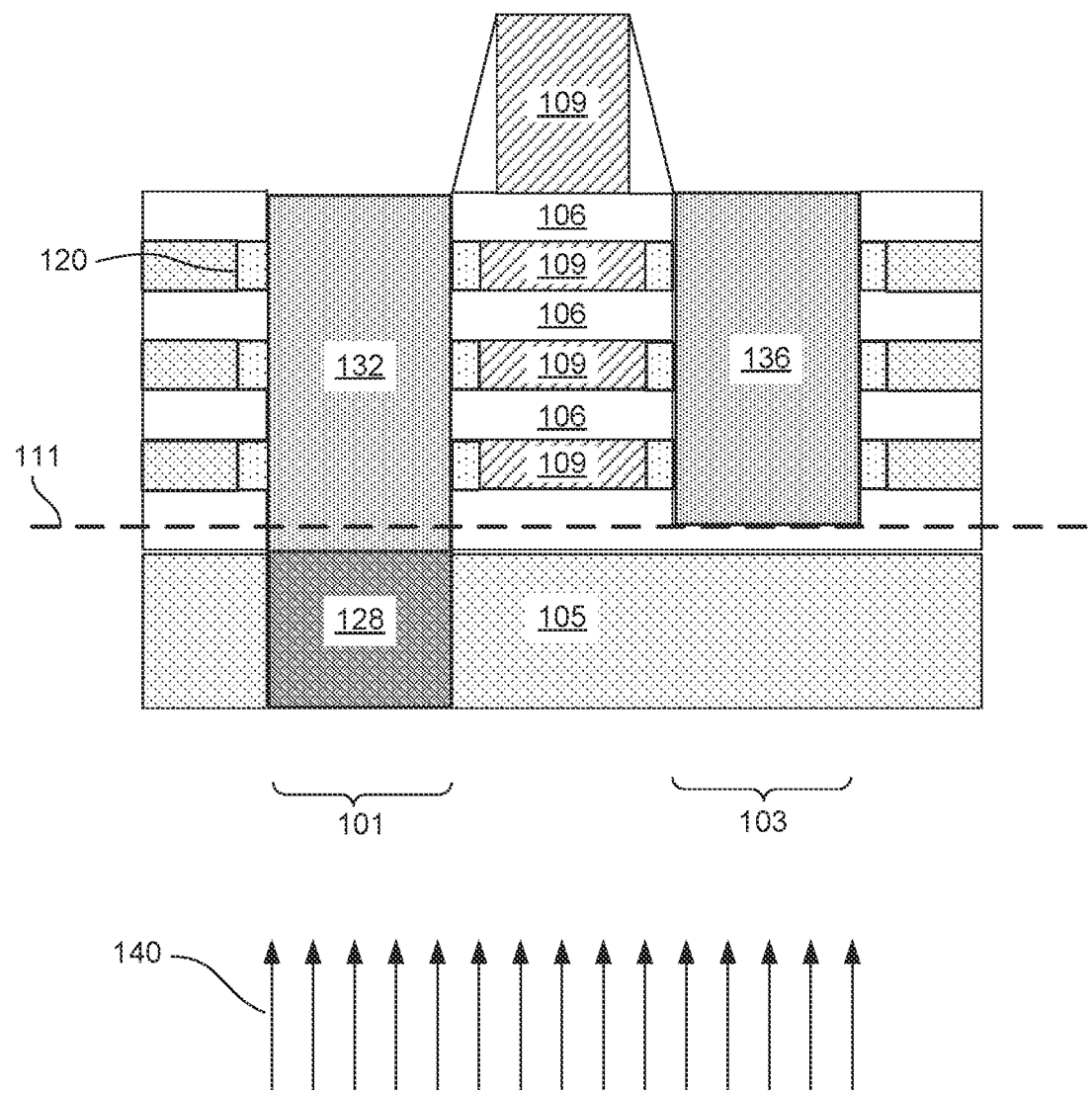

FIG. 1K illustrates a formation process 140 to form a dielectric layer 105 surrounding the dummy source contact structure 128. The dielectric layer 105 may be, for example, an interlayer dielectric layer (ILD). The dielectric layer 105 may be formed using a deposition process such as atomic layer deposition (ALD), or chemical vapor deposition (CVD).

Figure 1L:
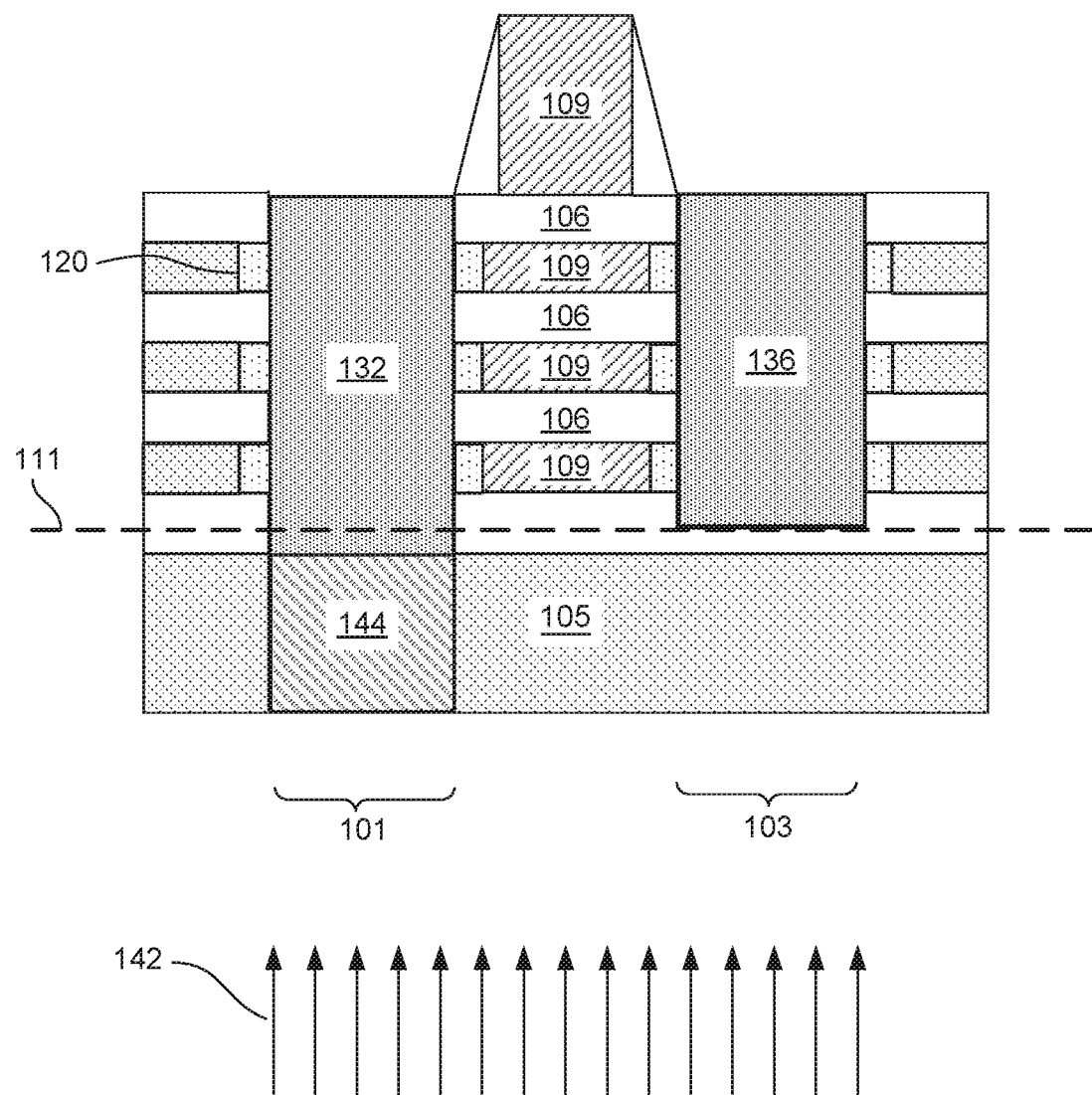

FIG. 1L illustrates a replacement process 142 for replacing the dummy source contact structure 128 with a real source contact 144. The replacement process 142 may include an etching process to remove the dummy source contact structure 128. The etching process may be selective so as to remove the dummy source contact structure 128 while leaving the dielectric layer 105 substantially intact. After the dummy source contact structure 128 has been removed, the recess left in place from the removal process can be filled with a metal or other conductive material to form the source contact 144.

Using the principles described herein, the source contact will be substantially similar in width to the source structure 132 at the junction between the source structure 132 and the source contact 144. This is because both the source structure 132 and the source contact 144 are formed within the same recess 112. The techniques provided herein provide better alignment and better electrical connectivity between the source contact 144 and the source structure 132. Additionally, using the techniques described herein, the source structure 132 may be slightly larger than the drain structure 136. Thus, the depth of the source and drain structures 132, 136 are asymmetric. This asymmetry may be within a range of about 1-5 nanometers. The asymmetry is the result of forming the dummy source contact region 128 so that its top surface is lower than the depth 111 of the drain region 136.

Additionally, because more etching is applied to the source region, the source structure will be larger in width than the drain structure.

Figure 2:
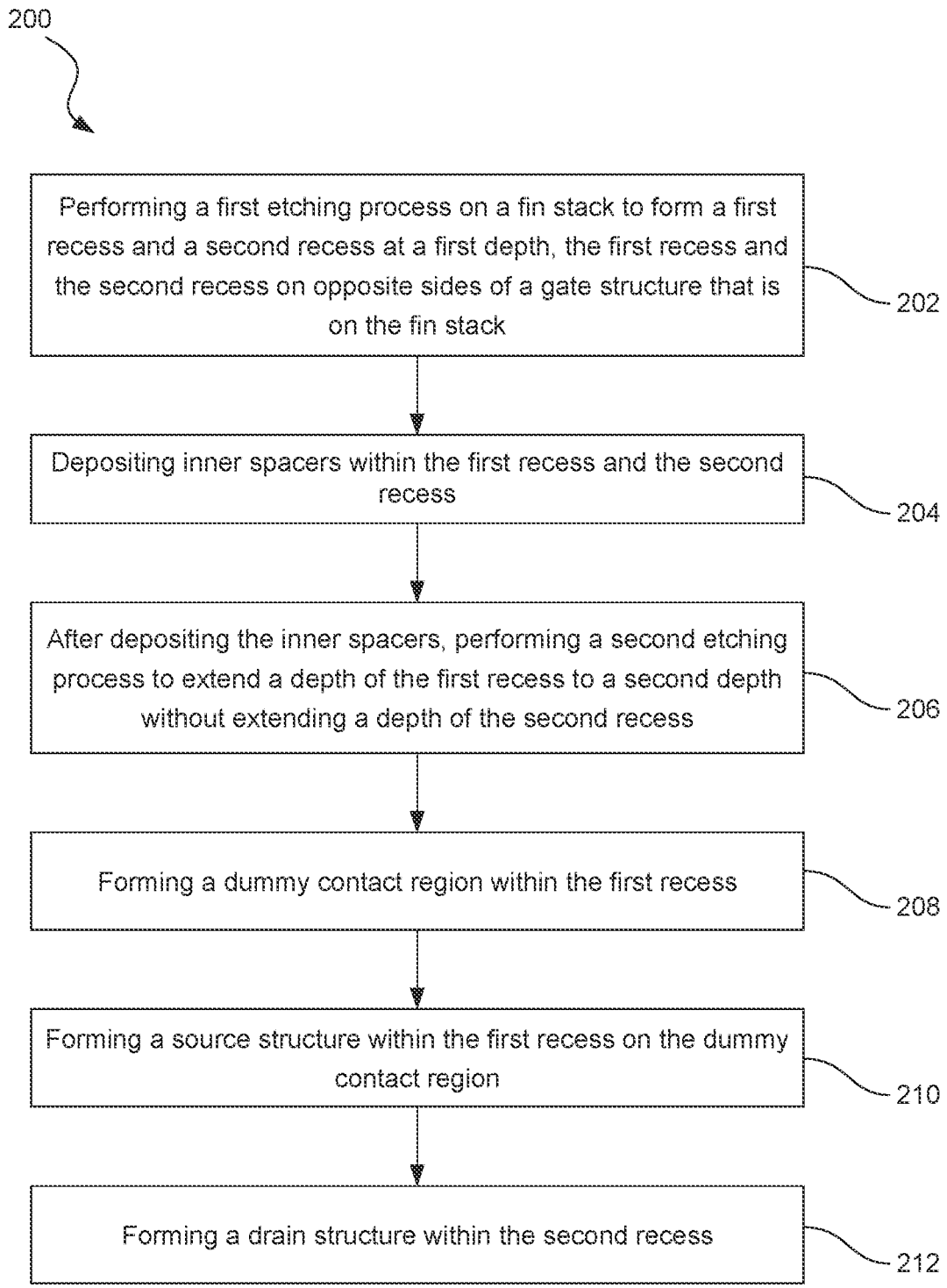
FIG. 2 is a flowchart showing an illustrative method for forming asymmetric source and drain structures for a backside contact, according to one example of principles described herein.

FIG. 2 is a flowchart showing an illustrative method for forming asymmetric source and drain structures for a backside contact. According to the present example, the method 200 includes a process 202 for performing a first etching process (e.g., 110) on a fin stack (e.g., 104, 106) to form a first recess (e.g., 112) and a second recess (e.g., 114) at a first depth (e.g., 111), the first recess and the second recess on opposite sides of a gate structure (e.g., 108) that is on the fin stack. The semiconductor substrate may be a silicon substrate. The semiconductor substrate may be part of a silicon wafer. The fin stack may include alternating semiconductor layers 104, 106 deposited onto the substrate. For example, a first type semiconductor layer may be deposited on the substrate. The first type semiconductor material is a sacrificial material that will ultimately be removed. Then, a second type semiconductor material is deposited. The second type semiconductor layer will ultimately form part of the channel of a nanostructure transistor device. Thus, the second type semiconductor layer will also be referred to as a channel semiconductor layer. Formation of both the first type semiconductor material and the second type semiconductor material may be done using an epitaxial growth process. The process of forming the first type semiconductor material and the second type semiconductor material may be repeated until the desired number of layers are reached. After the desired number of semiconductor layers has been achieved, a gate structure 108 may be formed on top of the fin stack. The gate structure may have sidewalls formed thereon. In some examples, the gate structure 108 may be a dummy gate structure that will eventually be replaced with a real metal or conductive gate.

The recesses may be formed within the fin stack in the regions (e.g., 101, 103) where the source and drain structures are to be formed. The patterning process may include a photolithographic process. For example, a hard mask layer and a photoresist layer may be deposited upon the workpiece. Then, the photoresist layer may be exposed to a light source through a photomask. The photoresist may then be developed. Then, an etching process may be applied to transfer the pattern in the photoresist to the hard mask layer. After this process, the hard mask exposes portions of the alternating set of semiconductor layers. Then, a directional etching process such as a dry etching process is used to pattern the semiconductor layers. The etching process may continue until the recesses reach a first depth that is within a range of about 55-75 nanometers.

The method 200 further includes a process 204 for depositing inner spacers (e.g., 120) within the first recess and the second recess. Forming the inner spacers may involve several steps. For example, forming the inner spacers may include a lateral etching process (e.g., 116) to partially remove the sacrificial semiconductor layers. The lateral etching process may be, for example, a wet etching process. The etching process may be designed to be selective so as to remove the sacrificial semiconductor layer without substantially affecting the semiconductor layer. Forming the inner spacers may then include a deposition process (e.g., 118) to form an inner spacer material along along sidewalls of the recesses, as well as along the floor of the recesses. The inner spacer layer may be a dielectric material such as SiCN, SiOCN, or SiON. Forming the inner spacers may further includes an etch back process (e.g., 122) to remove portions of the inner spacer layer and to expose the channel layers. The etch back process also removes the inner spacer layer from the floor of the recesses and the top of the workpiece. The remaining portions of the inner spacer layers serve to electrically isolate the portions of the gate structure and the source/drain structures to be formed. In some examples, the inner spacer layers may have a width that is within a range of about 4-15 nanometers.

The method 200 further includes a process 206 for, after depositing the inner spacers, performing a second etching process to extend a depth of the first recess to a second depth (e.g., 121) without extending a depth of the second recess. A third depth is defined as a combination of the first depth 111 and the second depth 121. The second patterning process may include a photolithographic process. For example, a hard mask layer and a photoresist layer may be deposited upon the workpiece. Then, the photoresist layer may be exposed to a light source through a photomask. The photoresist may then be developed. Then, an etching process may be applied to transfer the pattern in the photoresist to the hard mask layer. The patterned photomask layer may expose the source region but cover the drain region. Thus, the subsequent etching process used to extend the depth of the source recess is not applied to the drain recess. The etching process may extend the depth of the recess another 45-65 nanometers. If the depth is greater than 65 nanometers, a lateral recess increases resulting from an etching process, thereby increase current leakage, in some instances. If the depth is smaller than 45 nanometers, a subsequent backside contact is too close to the other source/drain feature and causes short circuit, in some instances. Accordingly, the source and drain recesses have asymmetric depths. In some embodiments, a ratio of the third depth to the first depth ranges from about 1.7 to about 2.2. If the ratio is greater than 2.2, a possibility of voltage breakdown increases, in some instances. If the ratio is smaller than 1.7, it is insufficient to reduce a contact resistance, which leads to a time constant delay, in some instances.

The method 200 further includes a process 208 for forming a dummy contact region (e.g., 128) within the first recess. The formation process may be, for example, an epitaxial growth process. The dummy source contact region may be, for example, made of silicon germanium without dopants. In some examples, the ratio of germanium to silicon in the silicon germanium may be within a range of about 30-40 percent.

The method 200 further includes a process 210 for forming a source structure within the first recess on the dummy contact region. The method 200 further includes a process 212 for forming a drain structure within the second recess. In some examples, the source and drain regions are created by performing an epitaxial growth process. An epitaxial growth process involves forming a crystal structure on a crystal substrate. In the present example, the source and drain regions 118 are grown from the substrate 102 and channel regions 106. In some examples, the source and drain regions 118 may be doped in situ so as to obtain the desired properties.

In some examples, after the source and drain structures are formed, a BEOL processing is performed to replace the dummy source contact structure with a real source contact structure. To do this, a removal process (e.g., 138) is applied to the backside of the workpiece to remove the backside portion of the substrate and expose the dummy source contact structure. This removal process may be, for example, a wet etching process. The wet etching process may be selective so as to remove the semiconductor substrate while leaving the dummy source contact structure substantially intact. A dielectric layer (e.g., 105) may then be formed around the dummy source contact structure. The dielectric layer may be, for example, an ILD layer. The dielectric layer may be formed using a deposition process such as atomic layer deposition (ALD), or chemical vapor deposition (CVD).

FIG. 1L illustrates a replacement process 142 for replacing the dummy source contact structure 128 with a real source contact 144. The replacement process 142 may include an etching process to remove the dummy source contact structure 128. The etching process may be selective so as to remove the dummy source contact structure 128 while leaving the dielectric layer 105 substantially intact. After the dummy source contact structure 128 has been removed, the recess left in place from the removal process can be filled with a metal or other conductive material to form the source contact 144.

Using the principles described herein, the source contact will be substantially similar in width to the source structure at the junction between the source structure and the source contact. This is because both the source structure and the source contact are formed within the same recess. The techniques provided herein provide better alignment and better electrical connectivity between the source contact and the source structure. Additionally, using the techniques described herein, the source structure may be slightly larger than the drain structure. Thus, the depth of the source and drain structures are asymmetric. This asymmetry may be within a range of about 1-5 nanometers. The asymmetry is the result of forming the dummy source contact region so that its top surface is lower than the depth of the drain region.

According to one example, a method includes performing a first etching process on a fin stack to form a first recess and a second recess at a first depth, the first recess and the second recess on opposite sides of a gate structure that is on the fin stack. The method further includes depositing inner spacers within the first recess and the second recess. The method further includes, after depositing the inner spacers, performing a second etching process to extend a depth of the first recess to a second depth. The method further includes forming a dummy contact region within the first recess, forming a source structure within the first recess on the dummy contact region, and forming a drain structure within the second recess.

According to one example, a method includes forming, on a substrate, a fin stack having a source region and a drain region separated by a gate structure. The method further includes performing a first etching process on the fin stack to recess a source region and a drain region to a first depth, depositing inner spacers along sidewalls of recesses within the source region and the drain region, performing a second etching process to extend a depth of the source region to a second depth, and forming a dummy contact region between the first depth and the second depth, exposing the dummy contact region from a backside, and replacing the dummy contact region with a functional contact.

A semiconductor device includes a finstack, a gate structure on the finstack, a source region on a first side of the gate structure, a drain region on a second side of the gate structure opposite the first side, and a source contact extending below the source region. The source region and the drain region are asymmetric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   performing a first etching process on a fin stack to form a first recess and a second recess at a first depth, the first recess and the second recess on opposite sides of a gate structure that is on the fin stack;
   depositing inner spacers within the first recess and the second recess;
   after depositing the inner spacers, performing a second etching process to extend a depth of the first recess to a second depth greater than the first depth;
   performing an epitaxial growth process to form a dummy contact region within the first recess;
   forming a source structure within the first recess on the dummy contact region; and
   forming a drain structure within the second recess.

2. The method of claim 1, wherein the first depth is within a range of about 55-75 nanometers.

3. The method of claim 1, wherein the second depth is about 45-65 nanometers greater than the first depth, and
   wherein performing the first etching process and performing the second etching process are from a front side of the fin stack.

4. The method of claim 1, wherein the fin stack includes alternating layers of a first semiconductor material and a second semiconductor material,
   wherein forming the source structure comprises forming the source structure on a top surface of the dummy contact region.

5. The method of claim 4, wherein the first semiconductor material comprises silicon germanium.

6. The method of claim 4, further comprising, before depositing the inner spacers, recessing the first semiconductor material.

7. The method of claim 1, wherein the dummy contact region comprises silicon germanium and is formed on a top surface of the substrate,
   wherein the source structure includes an epitaxial source structure, and
   wherein performing the second etching process is before forming the source structure.

8. The method of claim 1, further comprising, after performing the epitaxial growth process to form the dummy contact region within the first recess, removing a semiconductor substrate material from a back side of the substrate, while leaving the dummy contact region.

9. The method of claim 8, further comprising, after removing the semiconductor substrate material, forming a dielectric layer around the dummy contact region.

10. The method of claim 9, further comprising, removing the dummy contact region.

11. The method of claim 10, further comprising, filling the space left from removing the dummy contact region with a metal material to form a source contact.

12. A method comprising:
    forming, on a substrate, a fin stack having a source region and a drain region separated by a gate structure;

performing a first etching process on the fin stack from a front side to recess a source region and a drain region to a first depth;

depositing inner spacers along sidewalls of recesses within the source region and the drain region;

performing a second etching process from the front side to extend a depth of the source region to a second depth greater than the first depth;

forming a dummy contact region between the first depth and the second depth;

exposing the dummy contact region from a back side opposite to the front side; and replacing the dummy contact region with a functional contact.

13. The method of claim 12, wherein exposing the dummy contact region from the back side comprises an etching process to remove portions of the substrate to expose a physical bottom surface of the dummy contact region.

14. The method of claim 13, wherein replacing the dummy contact region comprises forming a dielectric layer around the dummy contact region.

15. The method of claim 14, wherein replacing the dummy contact region further comprises selectively removing the dummy contact region to leave a trench within the dielectric layer.

16. The method of claim 15, wherein replacing the dummy contact region comprises filling the trench with a conductive material to form the functional contact.

17. The method of claim 12, wherein a source structure formed in the source region is wider than a drain structure formed in the drain region, and wherein performing the second etching process exposes a top surface of the substrate in the source region.

18. A method comprising:

forming a fin stack over a substrate, the fin stack including alternating layers of a first semiconductor material and a second semiconductor material;

forming a gate structure over the fin stack, the gate structure separating a source region of the fin stack and a drain region of the fin stack;

performing a first etching process on the fin stack in the source region to form a source recess and in the drain region to form a drain recess to a same depth;

performing a second etching process to remove a portion of the substrate and to vertically extend the source recess;

forming a dummy contact within a lower portion of the source recess and on a top surface of the substrate;

forming a source feature within the source recess and over the dummy contact;

forming a drain feature within the drain recess; and replacing the dummy contact with a backside source contact.

19. The method of claim 18, wherein after performing the first etching process, the method further comprising:

performing a third etching process to form inner spacer recesses in the layers of the first semiconductor material; and forming inner spacers in the inner spacer recesses; and wherein performing the first etching process and performing the second etching process are from a front side of the fin stack.

20. The method of claim 18, wherein a difference between a depth of the source recess and a depth of the drain recess is in a range of about 45-65 nanometers, and wherein forming the dummy contact comprises epitaxially growing the dummy contact.

* * * * *